US008947992B2

(12) United States Patent
Little et al.

(10) Patent No.: US 8,947,992 B2
(45) Date of Patent: Feb. 3, 2015

(54) COMBINED ECHO AND CROSSTALK CANCELLATION

(71) Applicant: Vintomie Networks B.V., Dover, DE (US)

(72) Inventors: James M. Little, Sacramento, CA (US); Marwan Hassoun, Austin, TX (US); David Tetzlaff, Minnetonka, MN (US); Chang-Chi Liu, Fremont, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 0 days.

(21) Appl. No.: 13/935,234

(22) Filed: Jul. 3, 2013

(65) Prior Publication Data
US 2014/0010066 A1    Jan. 9, 2014

Related U.S. Application Data

(63) Continuation of application No. 13/025,942, filed on Feb. 11, 2011, now Pat. No. 8,488,438, which is a continuation of application No. 12/286,063, filed on Sep. 25, 2008, now Pat. No. 7,920,461, which is a continuation of application No. 12/012,908, filed on Feb. 5, 2008, now abandoned.

(60) Provisional application No. 60/900,180, filed on Feb. 7, 2007.

(51) Int. Cl.
*H04J 1/12*    (2006.01)
(52) U.S. Cl.
USPC ........................... 370/201; 370/252; 370/269

(58) Field of Classification Search
USPC ................................. 370/201, 252, 269, 465
See application file for complete search history.

(56) References Cited

U.S. PATENT DOCUMENTS

| | | | |
|---|---|---|---|
| 2005/0105473 A1 | 5/2005 | Hausman et al. | |
| 2005/0129223 A1* | 6/2005 | Piket et al. | 379/406.01 |
| 2005/0152463 A1 | 7/2005 | DeChamps et al. | |
| 2005/0152468 A1 | 7/2005 | Lozhkin | |
| 2005/0281188 A1 | 12/2005 | Cho et al. | |
| 2006/0007992 A1* | 1/2006 | Wang et al. | 375/224 |
| 2006/0056551 A1 | 3/2006 | Lozhkin | |
| 2006/0067447 A1 | 3/2006 | Lozhkin et al. | |
| 2006/0146945 A1 | 7/2006 | Chow et al. | |
| 2006/0268675 A1 | 11/2006 | Cho et al. | |
| 2007/0076805 A1 | 4/2007 | Kalluri et al. | |
| 2007/0258579 A1* | 11/2007 | Hirai et al. | 379/406.08 |
| 2007/0268811 A1* | 11/2007 | Clausen | 370/201 |
| 2009/0092036 A1* | 4/2009 | Peeters et al. | 370/201 |
| 2010/0074433 A1* | 3/2010 | Zhang et al. | 379/406.08 |
| 2011/0058468 A1* | 3/2011 | Singh et al. | 370/201 |
| 2011/0197232 A1* | 8/2011 | Sekiguchi | 725/44 |
| 2011/0290333 A1* | 12/2011 | Desjoyeaux et al. | 137/15.1 |

* cited by examiner

*Primary Examiner* — Andrew Lee
(74) *Attorney, Agent, or Firm* — Dorsey & Whitney LLP

(57) ABSTRACT

Combined echo and crosstalk cancellation is provided. Frequency domain adaptive filters are used to remove or reduce the effects of echo and crosstalk for a multi-channel and full-duplex communications system. Data from each transmit channel is buffered and converted to the frequency domain. The frequency domain data is multiplied by crosstalk coefficients to obtain a frequency domain correction signal for each channel. Adaptation of the crosstalk coefficients is based on correlations between the error signals and the data from each of the transmit channels. A single frequency domain transform engine, such as a Fast Fourier Transform engine, is employed for all calculations to save power and area.

20 Claims, 11 Drawing Sheets

| 512 POINT FFT | | 256 POINT FFT | |
|---|---|---|---|
| FFT_OP | DESCRIPTION | FFT_OP | DESCRIPTION |
| 00000 | SUBFRAME 0, POINT 0, ... | 10000 | SUBFRAME 0, POINT 0, ... |
| 00001 | SUBFRAME 1, POINT 8, ... | 10001 | SUBFRAME 1, POINT 1, ... |
| 00010 | SUBFRAME 2, POINT 2, ... | 10010 | SUBFRAME 2, POINT 2, ... |
| 00011 | SUBFRAME 3, POINT 14, ... | 10011 | SUBFRAME 3, POINT 3, ... |
| 00100 | SUBFRAME 4, POINT 4, ... | 10100 | SUBFRAME 4, POINT 4, ... |
| 00101 | SUBFRAME 5, POINT 12, ... | 10101 | SUBFRAME 5, POINT 5, ... |
| 00110 | SUBFRAME 6, POINT 6, ... | 10110 | SUBFRAME 6, POINT 6, ... |
| 00111 | SUBFRAME 7, POINT 10, ... | 10111 | SUBFRAME 7, POINT 7, ... |
| 01000 | SUBFRAME 8, POINT 1, ... | 11000 | NOT DEFINED |
| 01001 | SUBFRAME 9, POINT 15, ... | 11001 | NOT DEFINED |
| 01010 | SUBFRAME 10, POINT 3, ... | 11010 | NOT DEFINED |
| 01011 | SUBFRAME 11, POINT 13, ... | 11011 | NOT DEFINED |
| 01100 | SUBFRAME 12, POINT 5, ... | 11100 | NOT DEFINED |
| 01101 | SUBFRAME 13, POINT 11, ... | 11101 | NOT DEFINED |
| 01110 | SUBFRAME 14, POINT 7, ... | 11110 | NOT DEFINED |
| 01111 | SUBFRAME 15, POINT 9, ... | 11111 | NOT DEFINED |

| FFT1_OP | CODE |
|---|---|
| NORMAL | 000 |
| NORMALFIRST | 001 |
| NORMALLAST | 010 |
| ERROR | 100 |
| ERRORFIRST | 101 |
| ERRORLAST | 110 |

FIGURE 7

| SCALE FIELD | DEFINITION |
|---|---|
| FFT1_SCALE[6:5] | FFT INPUT GAIN, G1 ON GAIN DIAGRAM<br>00 - $2^0$ = 1, NO SHIFT<br>01 - $2^1$ = 2, LEFT SHIFT 1<br>10 - $2^2$ = 4, LEFT SHIFT 2<br>11 - $2^3$ = 8, LEFT SHIFT 3 |
| FFT1_SCALE[4:3] | FFT STAGE 1 FIRST RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT1_SCALE[2:1] | FFT STAGE 1 SECOND RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT1_SCALE[0] | FFT STAGE 1 RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[4] | FFT STAGE 2 FIRST RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[3:2] | FFT STAGE 2 RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT2_SCALE[1] | FFT STAGE 2 SECOND RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[0] | FFT STAGE 2 UNWIND STAGE OUTPUT DEVICE<br>0 - $2^0$ = 1, NO DIVIDE<br>1 - $2^{-1}$ = 0.5, DIVIDE BY 2 |

FIGURE 8

| 512 POINT IFFT | | 256 POINT IFFT | |
| --- | --- | --- | --- |
| IFFT_OP | DESCRIPTION | IFFT_OP | DESCRIPTION |
| 00000 | SUBFRAME 0, POINT 0, ... | 10000 | SUBFRAME 0, POINT 0, ... |
| 00001 | SUBFRAME 1, POINT 8, ... | 10001 | SUBFRAME 1, POINT 1, ... |
| 00010 | SUBFRAME 2, POINT 2, ... | 10010 | SUBFRAME 2, POINT 2, ... |
| 00011 | SUBFRAME 3, POINT 14, ... | 10011 | SUBFRAME 3, POINT 3, ... |
| 00100 | SUBFRAME 4, POINT 4, ... | 10100 | SUBFRAME 4, POINT 4, ... |
| 00101 | SUBFRAME 5, POINT 12, ... | 10101 | SUBFRAME 5, POINT 5, ... |
| 00110 | SUBFRAME 6, POINT 6, ... | 10110 | SUBFRAME 6, POINT 6, ... |
| 00111 | SUBFRAME 7, POINT 10, ... | 10111 | SUBFRAME 7, POINT 7, ... |
| 01000 | SUBFRAME 8, POINT 1, ... | 11000 | NOT DEFINED |
| 01001 | SUBFRAME 9, POINT 15, ... | 11001 | NOT DEFINED |
| 01010 | SUBFRAME 10, POINT 3, ... | 11010 | NOT DEFINED |
| 01011 | SUBFRAME 11, POINT 13, ... | 11011 | NOT DEFINED |
| 01100 | SUBFRAME 12, POINT 5, ... | 11100 | NOT DEFINED |
| 01101 | SUBFRAME 13, POINT 11, ... | 11101 | NOT DEFINED |
| 01110 | SUBFRAME 14, POINT 7, ... | 11110 | NOT DEFINED |
| 01111 | SUBFRAME 15, POINT 9, ... | 11111 | NOT DEFINED |

FIGURE 10

| SCALE FIELD | DEFINITION |
|---|---|
| FFT1_SCALE[5] | IFFT SATGE 1 WIND STAGE OUTPUT DIVIDE<br>0 - $2^0$ = 1, NO DIVIDE<br>1 - $2^{-1}$ = 0.5, DIVIDE BY 2 |
| FFT1_SCALE[4:3] | IFFT STAGE 1 FIRST RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT1_SCALE[2:1] | IFFT STAGE 1 SECOND RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT1_SCALE[0] | IFFT STAGE 1 RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[7] | IFFT STAGE 2 FIRST RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[6:5] | IFFT STAGE 2 RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT2_SCALE[4] | IFFT STAGE 2 SECOND RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[3:0] | IFFT STAGE 2 OUTPUT SCALING - SEE TABLE BELOW |

COMBINED ECHO AND CROSSTALK CANCELLATION

CROSS-REFERENCE TO RELATED APPLICATIONS

This application is a continuation of U.S. patent application Ser. No. 13/025,942, filed Feb. 11, 2011, and issued as U.S. Pat. No. 8,488,438 on Jul. 16, 2013, which is a continuation of U.S. patent application Ser. No. 12/286,063, filed Sep. 25, 2008, and issued as U.S. Pat. No. 7,920,461 on Apr. 5, 2011, which is a continuation of U.S. patent application Ser. No. 12/012,908, filed Feb. 5, 2008, now abandoned, which claims priority to U.S. Provisional Application No. 60/900,180, filed Feb. 7, 2007. These applications and patent are each incorporated herein by reference, in their entirety, for any purpose.

FIELD OF THE INVENTION

The present invention relates generally to echo and crosstalk cancellation. More particularly, the present invention relates to frequency domain adaptive filters for echo and crosstalk cancellation.

BACKGROUND

Communications systems, including 10GBase-T Ethernet systems, may make use of cancellation to improve the accuracy of communications. Noise to be cancelled may include echo and crosstalk.

SUMMARY

Embodiments of the invention provide combined echo and crosstalk cancellation. Frequency domain adaptive filters may be used to remove or reduce the effects of echo and crosstalk for a multi-channel and full-duplex communications system. Data from each transmit channel may be buffered and converted to the frequency domain. The frequency domain data may be multiplied by crosstalk coefficients to obtain a frequency domain correction signal for each channel. Adaptation of the crosstalk coefficients may be based on correlations between the error signals and the data from each of the transmit channels. A single frequency domain transform engine, such as a Fast Fourier Transform engine, may be employed for all calculations to save power and area.

BRIEF DESCRIPTION OF THE FIGURES

FIG. 7 is a table of FFT opcodes in accordance with an embodiment of the present invention.

FIG. 8 is a table of FFT scaling definitions in accordance with an embodiment of the present invention.

FIG. 10 is a table of IFFT opcodes in accordance with an embodiment of the present invention.

FIG. 11 is a table of IFFT scaling definitions in accordance with an embodiment of the present invention.

DETAILED DESCRIPTION

Echo/NEXT Function

Figure 1:
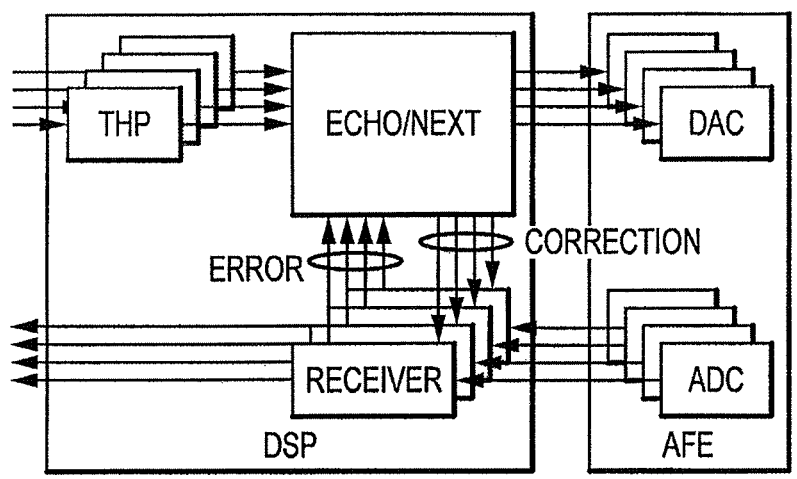
FIG. 1 is a schematic illustration of a DSP system including an Echo/NEXT block in accordance with an embodiment of the present invention.

The Echo/NEXT block fits in the DSP system as shown in FIG. 1. On the transmit data path, the Echo/NEXT block buffers data from the output of the THP, and after the Echo/NEXT correction has been calculated, it outputs the Tx data to the DACs in the AFE. On the receive data path, the Echo/NEXT block uses an error signal from the receiver to adapt the Echo/NEXT, and generates a correction signal that is subtracted from the receive signal.

Figure 2:
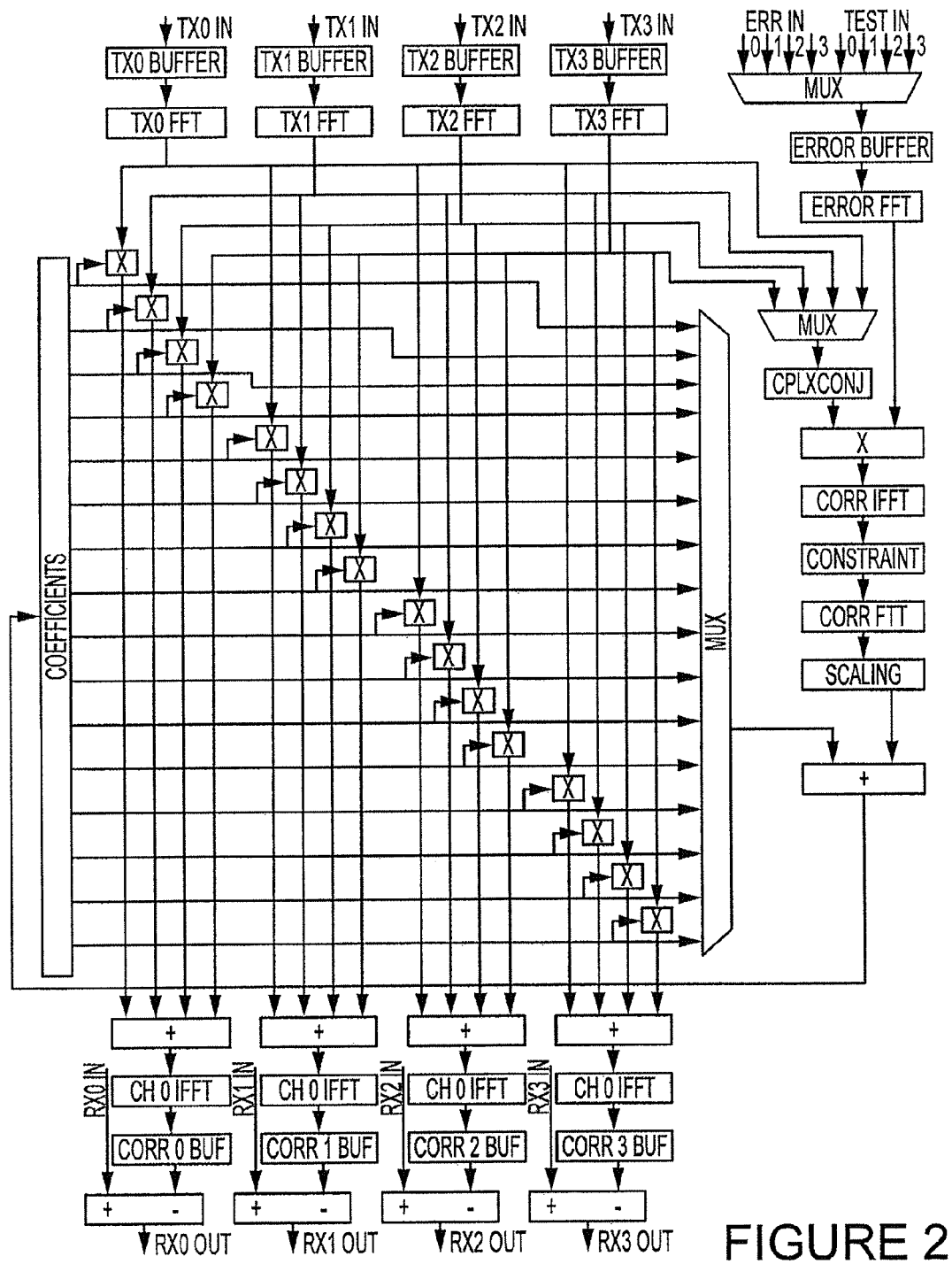
FIG. 2 is a schematic illustration of a frequency domain approach for correlating the error signal to the transmit data in accordance with an embodiment of the present invention.

The Echo/NEXT uses a frequency domain approach for correlating the error signal to the transmit data. The algorithm is illustrated in FIG. 2. Data from each transmit THP channel is buffered into a echonext frame of samples. Each echonext frame is 512 samples, and echonext frames are not correlated to data or LDPC frames. The data then converted to the frequency domain using an FFT. Data frequency domain transmit data is multiplied by the echo and crosstalk coefficients. The frequency domain correction for each channel is summed from the 4 aggressors. The frequency domain correction is then converted to time domain correction samples with an IFFT.

Adaptation is performed by correlating the error signal from each receiver with each of the 4 channels of transmit data. The error signal from one of the receivers is buffered, converted to the frequency domain with the FFT. Correlation in the frequency domain is performed by multiplying the FFT output of the error channel with the FFT output of one the transmit channels. This value is scaled and used to update the coefficients. Only some of the coefficients are updated on each frame of input data, but over the course of several frames, all the coefficients are updated.

Echo/NEXT Architecture

Figure 3:
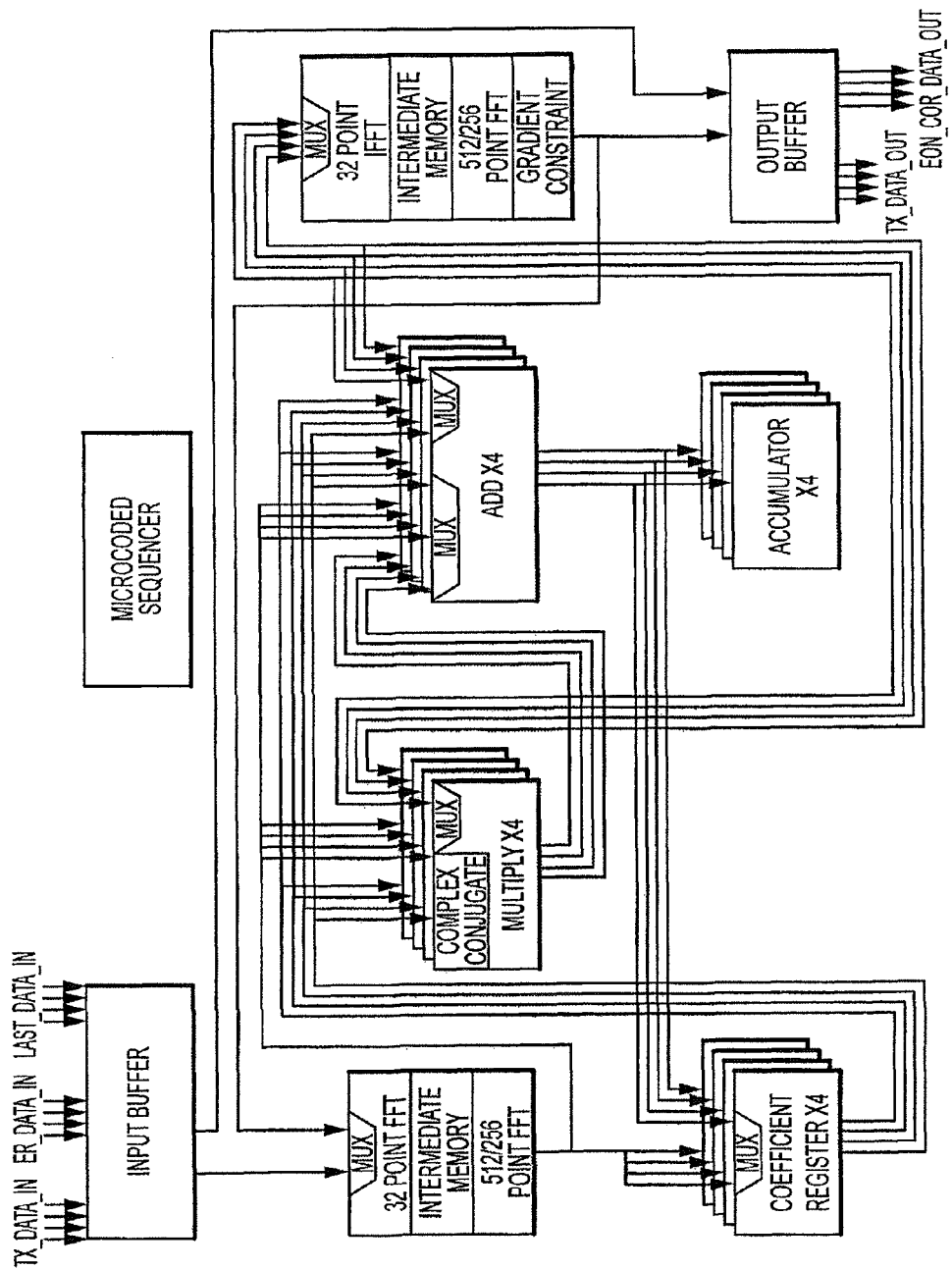
FIG. 3 is a schematic illustration of an Echo/NEXT canceller block in accordance with an embodiment of the present invention.
Figure 4:
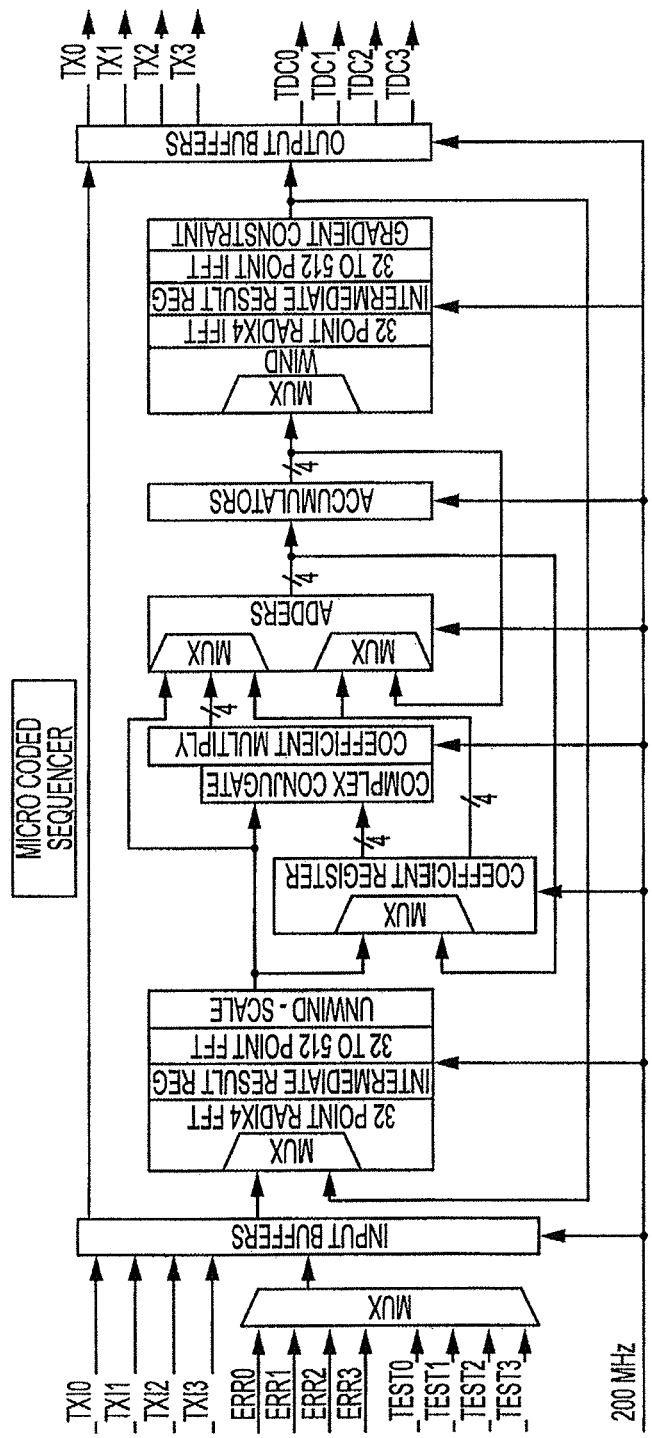
FIG. 4 is a schematic illustration of a data flow within an Echo/NEXT canceller block in accordance with an embodiment of the present invention.
Figure 5:
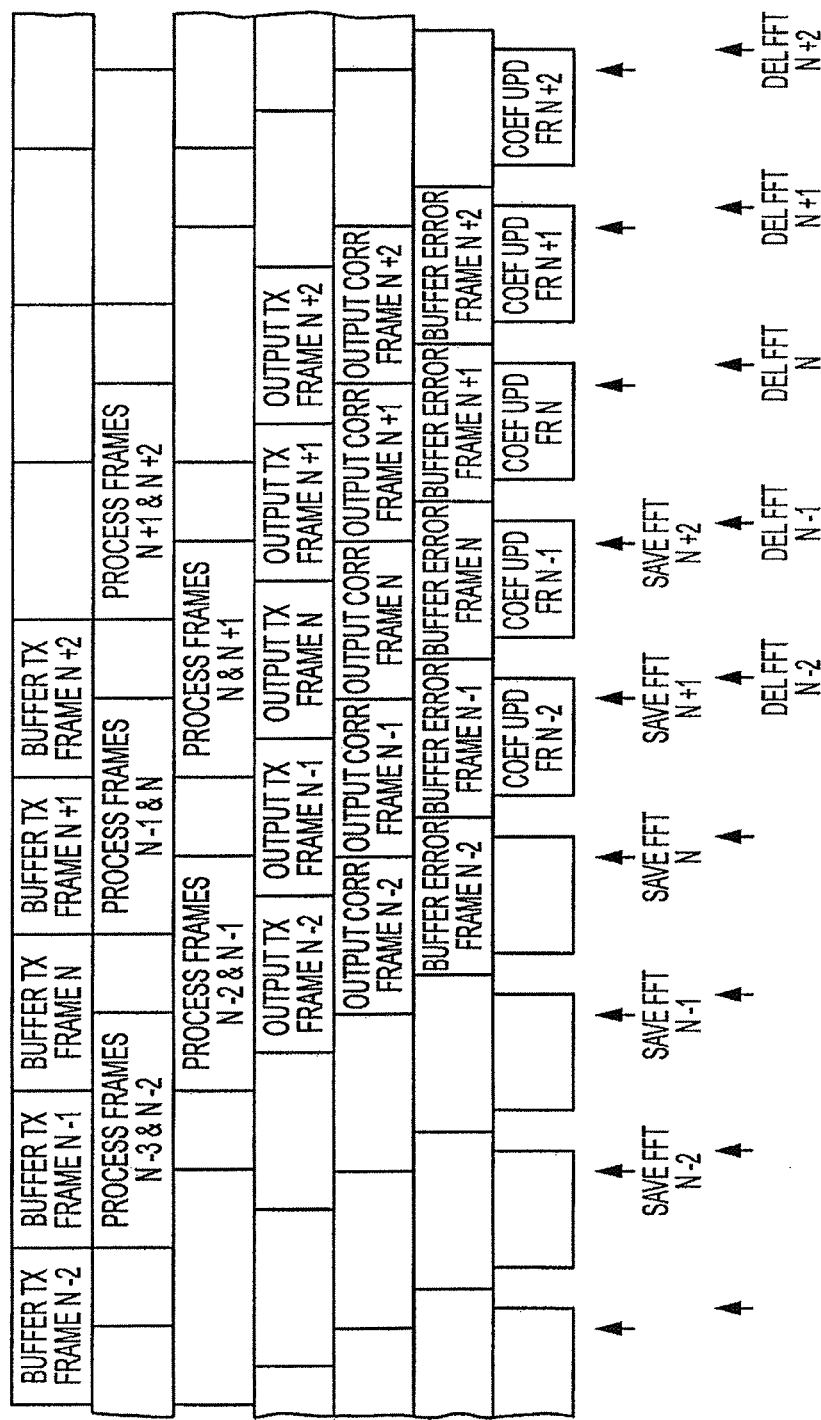
FIG. 5 is a schematic illustration of frame sampling in an Echo/NEXT canceller block in accordance with an embodiment of the present invention.
Figure 6:
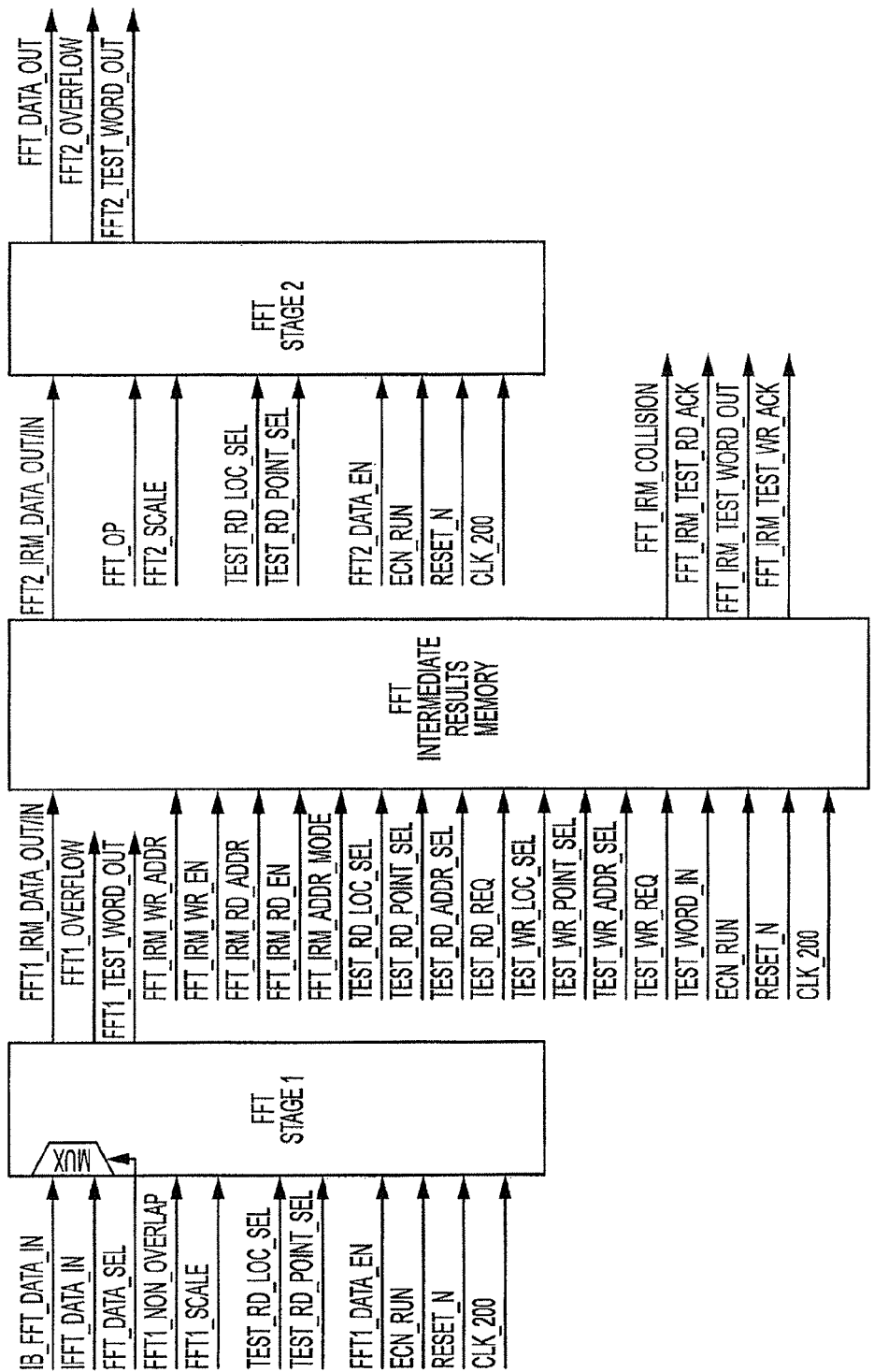
FIG. 6 is a schematic illustration of a 32 complex point FFT engine in accordance with an embodiment of the present invention.
Figure 9:
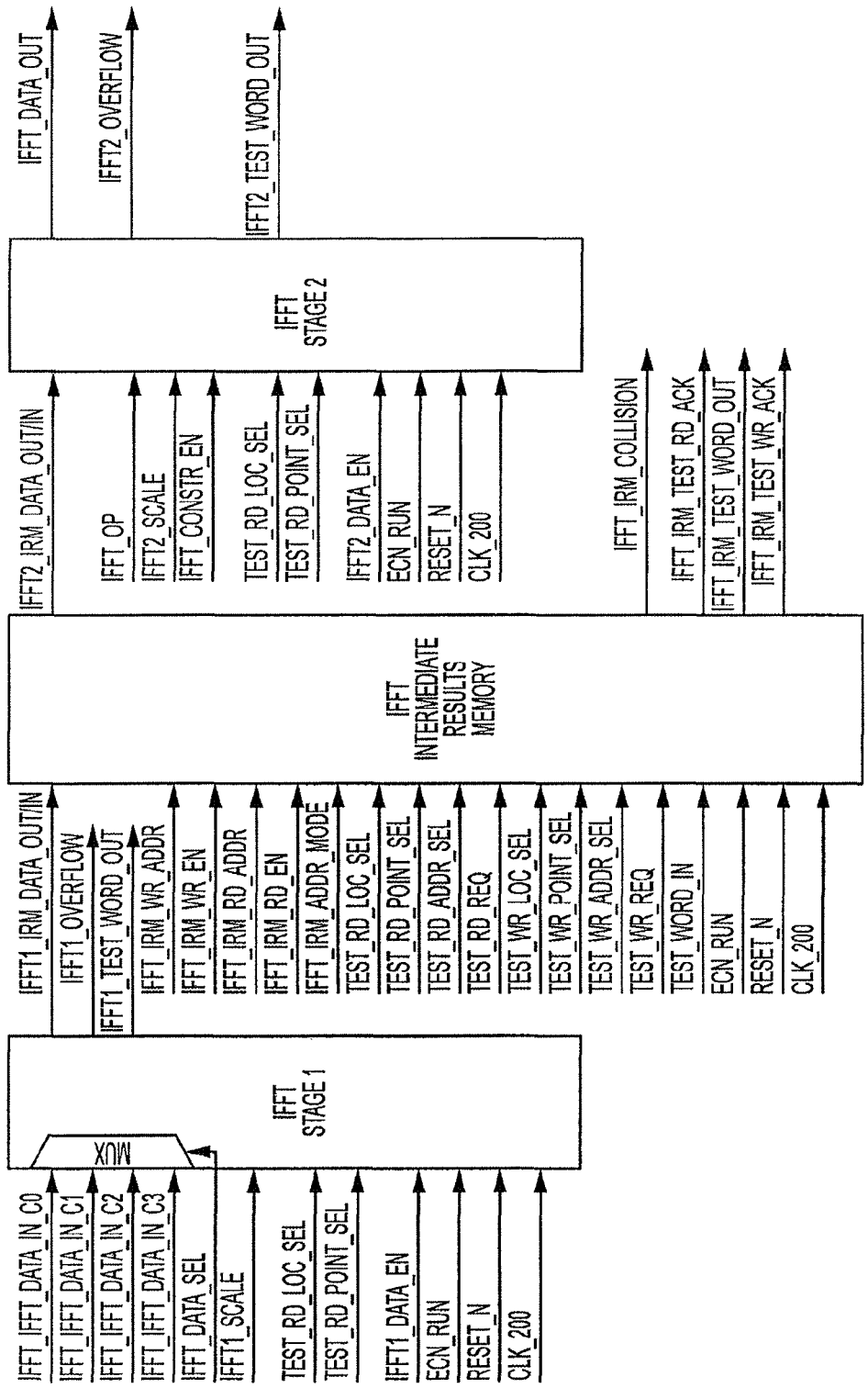
FIG. 9 is a schematic illustration of a 32 complex point IFFT engine in accordance with an embodiment of the present invention.

The Echo/NEXT canceller block is a special purpose processor consisting of 4 computational units and 4 memory units (FIG. 3). Internal to the FFT and IFFT computation units, there are two additional memories for buffer and reordering intermediate data. These units are controlled by a microcoded sequencer. A more detailed view of the data flow is shown in FIG. 4. Frames of 512 or 256 samples are collected in the input buffer. Groups of two frames (1024 or 512 samples) are processed every 512 or 256 samples (FIG. 5). After the processing is complete, the transmit data is output to the AFE transmit DACs, and the correction data is output to the receiver summing node.

FFT

The FFT engine performs operations on groups of 32 complex points. The real only input data allows the mapping of 64 real points to 32 complex points. A 512 complex point FFT requires 16 passes through the FFT engine, and 8 passes are required for a 256 point FFT. The first stage of the FFT performs a 32 point complex FFT using fixed twiddle factors to reduce the size of the multipliers. The intermediate data from this stage is stored in the FFT Intermediate Result Memory. After all the input data has been processed by the first stage and stored in the intermediate memory, the second stage processes the data in groups of 32 points, but with the data reordered as required to perform the FFT. The second stage has look-up tables for the twiddle factors based on which point of the complete FFT are being processed. The fft_op signal specifies the operation (Table 7), which includes which pass of the FFT is being performed. The fft1_non_overlap signal specifies that an FFT is to be performed without overlap, so the first half of the data points should be forced to zero. This mode is used for computing the FFT of the error data. The fft1 scale and fft2 scale signals set the scaling used in the FFT (Table 8). Stage 2 includes a final stage unwinds the 512 complex frequency domain points.

IFFT

The IFFT engine processes the frequency domain cancellation signal that has be summed in the accumulator. Groups of 32 complex points are processed to generate a 512 or 256 point IFFT, similar to the FFT engine. To correctly map the data to a half length complex IFFT, a wind operation precedes the initial IFFT. The first stage IFFT uses constant twiddle factors, and the second stage has a look-up table for the twiddle factors based on which data point of the full IFFT are being processed. The IFFT intermediate memory reorders the data for the second stage of IFFT calculations. The ifft_op signal specifies the operation, including which passes of the IFFT is being performed. When the ifft_constr_en is active, the gradient constraint is applied to the output of the IFFT.

Details of various embodiments of the present invention are also disclosed in the following appendices:

Appendix I: a 118-page document by the inventors.
Appendix II: a 2-page document by the inventors.
Appendix III: a 1-page document by the inventors As one of ordinary skill in the art will appreciate, various changes, substitutions, and alterations could be made or otherwise implemented without departing from the principles of the present invention. Accordingly, the examples and drawings disclosed herein including the appendices are for purposes of illustrating the preferred embodiments of the present invention and are not to be construed as limiting the invention.

What is claimed is:

1. A method, comprising:
    transforming data of a first signal from a first domain to a second domain using a transform unit, wherein the first signal is configured to be transmitted over a first channel;
    transforming data of a second signal from the first domain to the second domain, wherein the second signal is configured to be transmitted over a second channel;
    generating a correction signal having correction data based on the data of the first signal in the second domain and a plurality of coefficients;
    transforming the correction data of the correction signal from the second domain to the first domain; and
    combining a received signal with the correction signal first domain.

2. The method of claim 1, wherein the first domain is a time domain and the second domain is a frequency domain.

3. The method of claim 1, further comprising:
    prior to said transforming data of a first signal, buffering the data of the first signal; and
    prior to said transforming data of a second signal, buffering the data of the second signal.

4. The method of claim 1, further comprising receiving the received signal via the first channel.

5. The method of claim 1, wherein said generating a correction signal having correction data is further based on the data of the second signal in the second domain.

6. The method of claim 5, wherein said generating a correction signal having correction data comprises:
    multiplying the data of first signal in the second domain by at least one of the plurality of coefficients to generate first correction data;
    multiplying the data of second signal in the second domain by a second one of the plurality of coefficients to generate second correction data; and
    adding the first correction data to the second correction data to generate the correction data of the correction signal.

7. The method of claim 1, wherein said combining a received signal with the correction signal in the first domain comprises subtracting the correction signal from the received signal.

8. The method of claim 1, further comprising generating at least one of the plurality of coefficients based on echo characteristics of the first channel.

9. The method of claim 1, further comprising generating at least one of the plurality of coefficients based on crosstalk between the first channel and the second channel.

10. An apparatus, comprising:
    a first transform unit configured to sequentially transform data of individual ones of a plurality of signals from a first domain to a second domain, wherein the individual ones of the plurality of channels are configured for transmission over a respective channel;
    a correction unit configured to receive data of at least one of the plurality of signals in the second domain and to generate a correction signal having correction data in the second domain, wherein the correction data is based on the received data of the at least one of the plurality of signals in the second domain and a plurality of coefficients; and
    a second transform unit configured to transform the correction data of the correction signal from the second domain to the first domain.

11. The apparatus claim 10, wherein the first domain is a time domain and the second domain is a frequency domain.

12. The apparatus of claim 10, wherein the correction unit is configured to generate the correction signal having the correction data, at least in part, by multiplying the received data of individual ones of the at least one of the plurality of signals in the second domain with at least one of the plurality of coefficients 13. The apparatus of claim 10, further comprising a combiner configured to combine the correction signal in the first domain with a second signal received over at least one of the plurality of channels.

14. The apparatus of claim 10, further comprising a multiplexer configured to sequentially provide the individual ones of the plurality of signals to the transform unit.

15. The apparatus of claim 10, further comprising a buffer configured to buffer the data of the individual ones of the plurality of signals.

16. The apparatus of claim 10, further comprising a register configured to store the plurality of coefficients.

17. A apparatus, comprising:
    an interference canceller configured to receive, in a first domain, a first signal and a second signal, wherein the first signal is configured for transmission over a first channel, wherein the second signal is configured for transmission over a second channel, and wherein the interference canceller includes:
a first transform unit configured to sequentially transform, from the first domain to a second domain, data of the first signal and data of the second signal;
an error correction unit configured to generate a correction signal having correction data in the second domain, wherein the correction data is based on the data of the first signal in the second domain and a plurality of coefficients; and
a second transform unit configured to transform the data of the correction signal from the second domain to the first domain; and
a receiver coupled to the interference canceller and configured to receive a third signal in the first domain and the correction signal in the first domain, wherein the receiver is further configured to combine the third signal with the correction signal in the first domain.

18. The apparatus of claim 17, further comprising an analog-to-digital converter configured to convert the third signal from an analog signal to a digital signal, wherein the analog-to-digital converter is further configured to provide the digital signal to the receiver.

19. The apparatus of claim 17, further comprising a coefficient generator configured to generate at least one of the plurality of coefficients based on echo characteristics of the first channel, wherein the coefficient generator is further configured to generate at least one of the plurality of coefficients based on crosstalk between the first channel and the second channel.

20. The apparatus of claim 17, wherein the error correction unit is further configured to:
multiply the data of the first signal in the second domain with at least one of the plurality of coefficients to generate first correction data;
multiply the data of the second signal in the second domain with at least one of the plurality of coefficients to generate second correction data; and
add the first correction data to the second correction data to generate the correction data of the correction signal.

* * * * *